United States Patent
Tsai et al.

(10) Patent No.: US 10,043,811 B1
(45) Date of Patent: Aug. 7, 2018

(54) SEMICONDUCTOR STRUCTURE FOR PREVENTING ROW HAMMERING ISSUE IN DRAM CELL AND METHOD FOR MANUFACTURING THE SAME

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Chih-Chieh Tsai, Kaohsiung (TW); Pin-Hong Chen, Tainan (TW); Tzu-Chieh Chen, Pingtung County (TW); Tsun-Min Cheng, Changhua County (TW); Yi-Wei Chen, Taichung (TW); Hsin-Fu Huang, Tainan (TW); Chi-Mao Hsu, Tainan (TW); Shih-Fang Tzou, Tainan (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/627,455

(22) Filed: Jun. 20, 2017

(30) Foreign Application Priority Data

May 18, 2017 (CN) .......................... 2017 1 0351696

(51) Int. Cl.
*H01L 27/108* (2006.01)

(52) U.S. Cl.
CPC .. *H01L 27/10891* (2013.01); *H01L 27/10814* (2013.01); *H01L 27/10823* (2013.01)

(58) Field of Classification Search
CPC ......... H01L 27/10891; H01L 27/10814; H01L 27/10823; H01L 29/4236
See application file for complete search history.

(56) References Cited

U.S. PATENT DOCUMENTS

| | | | |
|---|---|---|---|
| 2008/0211057 A1* | 9/2008 | Lee | H01L 27/10876 257/520 |
| 2012/0086074 A1* | 4/2012 | Hwang | H01L 27/10876 257/334 |
| 2012/0091587 A1* | 4/2012 | Or-Bach | H01L 21/6835 257/741 |
| 2013/0049141 A1* | 2/2013 | Cheng | H01L 29/4966 257/412 |
| 2013/0168744 A1* | 7/2013 | Hsu | H01L 21/82384 257/288 |
| 2015/0214314 A1* | 7/2015 | Oh | H01L 29/4236 257/330 |
| 2015/0349073 A1* | 12/2015 | Kang | H01L 29/4236 257/330 |
| 2016/0233220 A1* | 8/2016 | Danek | H01L 27/10891 |
| 2017/0076995 A1* | 3/2017 | Chang | H01L 21/823842 |

OTHER PUBLICATIONS

Chang, Title of Invention: Semiconductor Device and Method for Fabricating the Same, U.S. Appl. No. 15/611,759, filed Jun. 1, 2017.
Lee, DRAM Life Extension Challenge and Response, Dec. 6, 2015.

* cited by examiner

*Primary Examiner* — Walter H Swanson
(74) *Attorney, Agent, or Firm* — Winston Hsu

(57) ABSTRACT

A semiconductor structure for preventing row hammering issue in DRAM cell is provided in the present invention. The structure includes a trench with a gate dielectric, an n-type work function metal layer, a TiN layer conformally formed within, and a buried word line filled in the trench.

7 Claims, 6 Drawing Sheets

SEMICONDUCTOR STRUCTURE FOR PREVENTING ROW HAMMERING ISSUE IN DRAM CELL AND METHOD FOR MANUFACTURING THE SAME

BACKGROUND OF THE INVENTION

1. Field of the Invention

The present invention relates generally to a semiconductor structure, and more specifically, to a semiconductor structure for preventing a row hammering issue in DRAM cells and methods for manufacturing the same.

2. Description of the Prior Art

With advances in computing technology, computing devices are smaller and have much more processing power. Additionally, they include more and more storage and memory to meet the needs of the programming and computing performed on the devices. The shrinking size of the devices together with the increased storage capacity is achieved by providing higher density devices, where the atomic storage units within a memory device have smaller and smaller geometries.

With the latest generation of increased density, intermittent failure has appeared in some devices. For example, some existing DDR3 based systems experience intermittent failures with heavy workloads. Researchers have traced the failures to repeated access to a single row of memory within the refresh window of the memory cell. For example, for a 32 nm process, the physically adjacent word line (WL) to the accessed row has a very high probability of experiencing data corruption. The failure issue has been labeled as a "row hammer" issue by the DRAM industry where it is frequently seen.

The row hammering issue can cause charge migration across the passgate (PG). As it is shown in FIG. 1, the parasitic electron is easily induced and leaked from passgate (PG) to bit line contact (BLC) through path 1 by the repeated access to one row, thereby causing data corruption in a non-accessed physically adjacent row. The electron may also be easily trapped by electron-hole recombination into a P-well through path 2. Both conditions would cause data "0" failure.

One approach identified to deal with the failure due to row hammer is to limit the number of accesses allowed per row per refresh cycle, which has performance impacts in the system. Another approach identified to address the row hammer failure includes decreasing the bottom critical dimension (BCD) in the buried channel array transistor (BCAT). However, changing the dimensional sizes of the devices has both physical and practical limitations. To the extent certain dimensions may now be changed, it would still require changes to the manufacturing processes.

Another approach to dealing with the row hammer issue is to decrease the time between refreshes. However, the refresh time has already been held constant even as the density of the devices has increased. Current devices are required to perform refresh on larger and larger areas in the same period of time. Thus, further decreasing the refresh time would cause a performance impact in the system, such as by requiring additional refresh overhead in the memory devices.

A need exists for an effective method and mechanism for implementing row hammer avoidance in dynamic random access memory (DRAM). It is desirable to provide such method and mechanism without substantially changing the design of the DRAM or the design of dual inline memory modules (DIMM).

SUMMARY OF THE INVENTION

One objective of the present invention is to provide a semiconductor structure for preventing row hammering issue in DRAM cell. The structure is specifically provided an n-type work function metal layer to tune the work function of the buried word line, thereby preventing the row hammering issue resulted from the word line leakage to a non-accessed physically adjacent row.

To achieve the objective, the preferred embodiment of the present invention provides a semiconductor structure for preventing row hammering issue in DRAM cell, which include a substrate, a trench, a gate dielectric conformally on the trench, a work function metal layer conformally on the gate dielectric, and a buried word line on the work function metal layer, wherein the work function metal layer includes materials of titanium and titanium nitride, and the ratio of titanium nitride to titanium in the work function metal layer gradually increases from the side of work function metal layer adjacent to the gate dielectric to the other side of work function metal layer adjacent to the buried word line.

To achieve the objective, another embodiment of the present invention provides a semiconductor structure for preventing row hammering issue in DRAM cell, which includes a substrate, a trench, a gate dielectric conformally on the trench, an n-type work function metal layer conformally on the gate dielectric, a titanium nitride layer conformally on the n-type work function metal layer, and a buried word line on the titanium nitride layer.

To achieve the objective, still another embodiment of the present invention provides a method of manufacturing a semiconductor device for preventing row hammering issue in DRAM cell, which includes the steps of providing a substrate, forming a trench in the substrate, forming a gate dielectric conformally on the trench, forming an n-type work function metal layer conformally on the substrate and the gate dielectric, forming a titanium nitride layer conformally on the n-type work function metal layer, and filling a buried word line in the trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
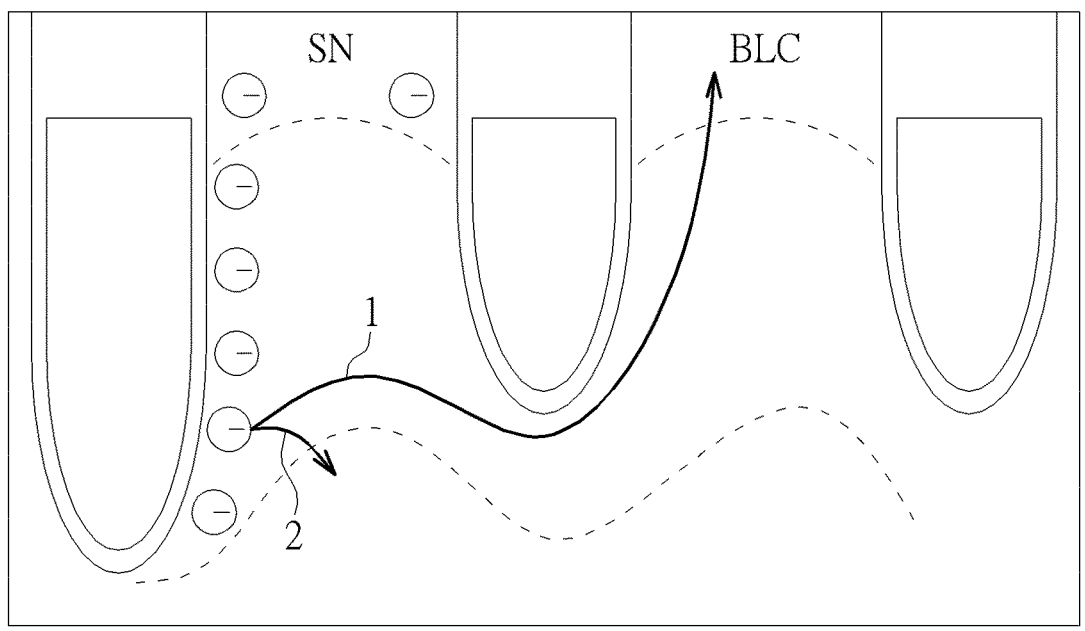
FIG. 1 is a schematic view explaining the row hammering mechanism in a DRAM.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Figure 2:
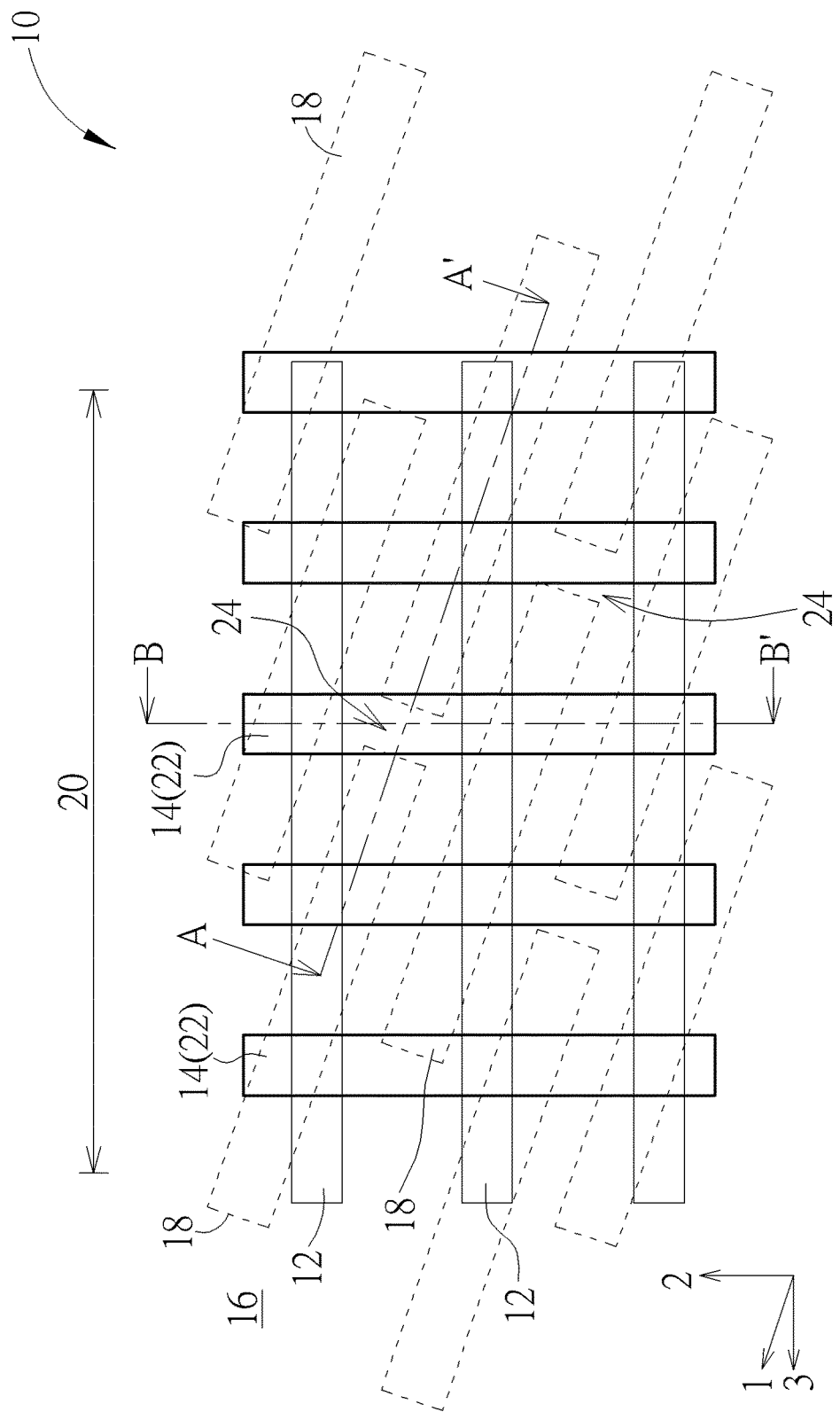
FIG. 2 is a layout of DRAM cells.
Figure 3:
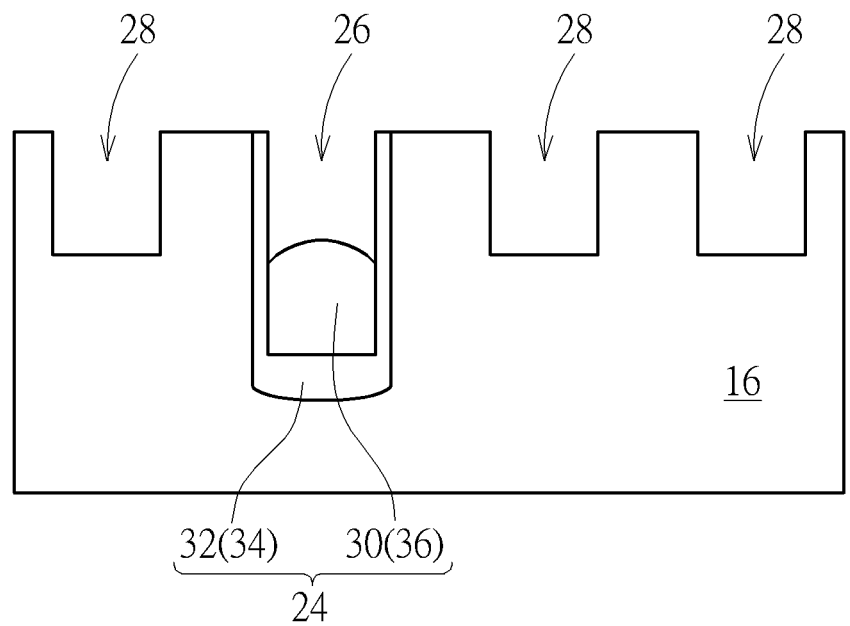
FIGS. 3, 5, 6 and 8 are cross-sectional views of the manufacturing processes of a DRAM cell in different steps taken along the line A-A' in FIG. 2 in accordance with one preferred embodiment of the present invention.
Figure 4:
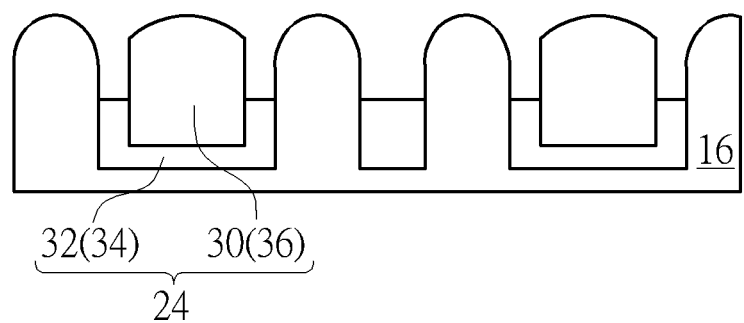
FIGS. 4 and 9 are cross-sectional views of the manufacturing processes of a DRAM cell in different steps taken along the line B-B' in FIG. 2 in accordance with one preferred embodiment of the present invention.
Figure 5:
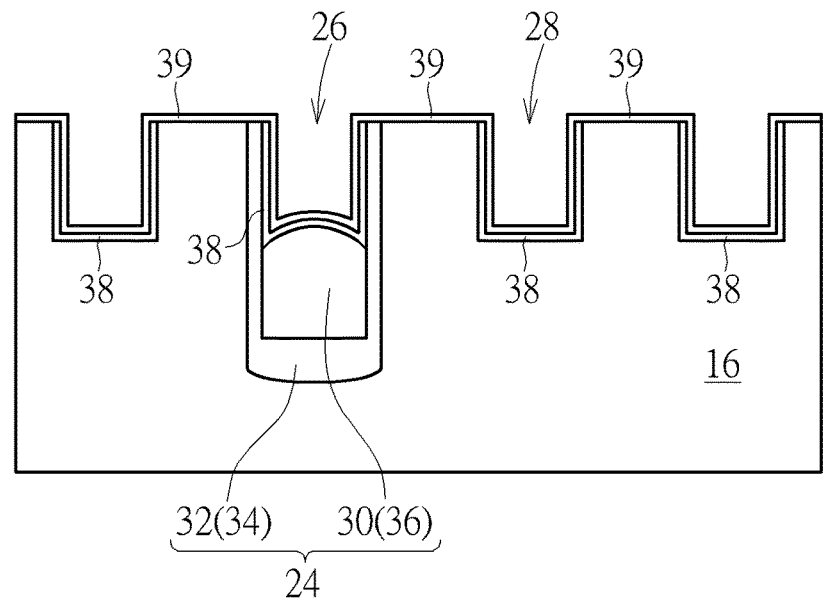
Figure 6:
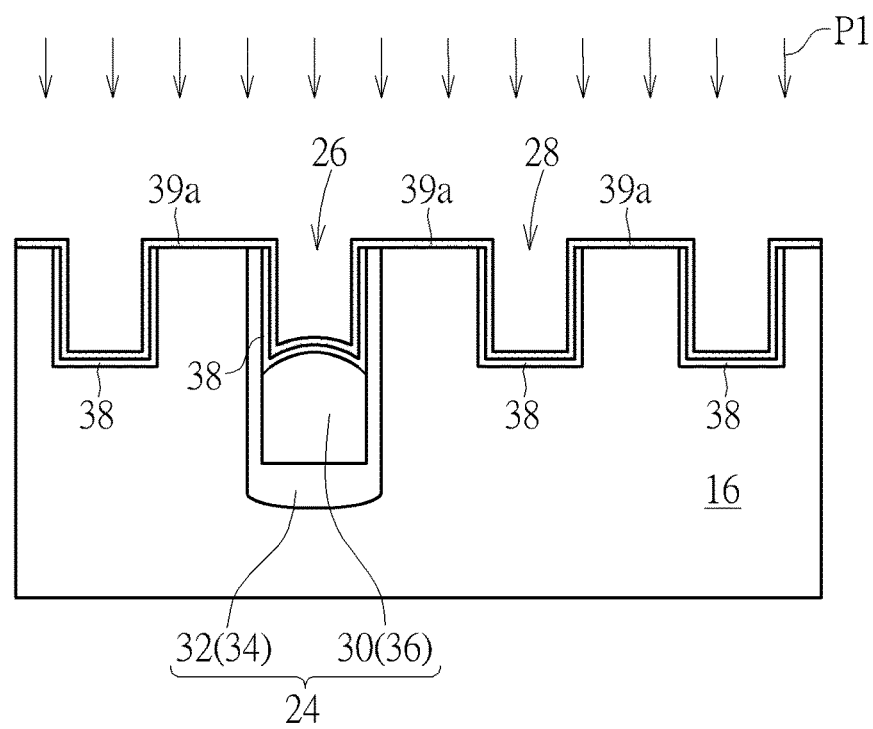
Figure 7:
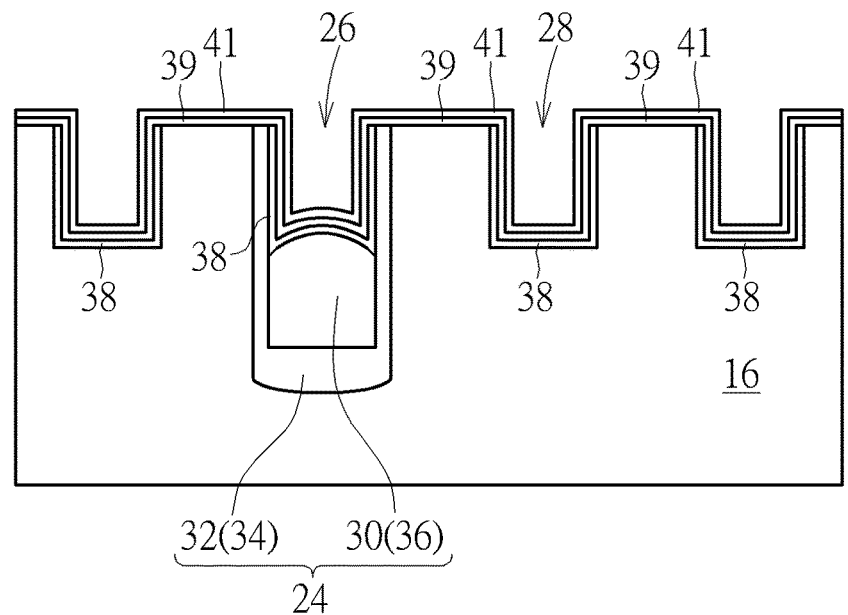
FIG. 7 is a cross-sectional view of the manufacturing processes of the titanium nitride layer in a DRAM cell taken along the line A-A' in FIG. 2 in accordance with one preferred embodiment of the present invention.
Figure 8:
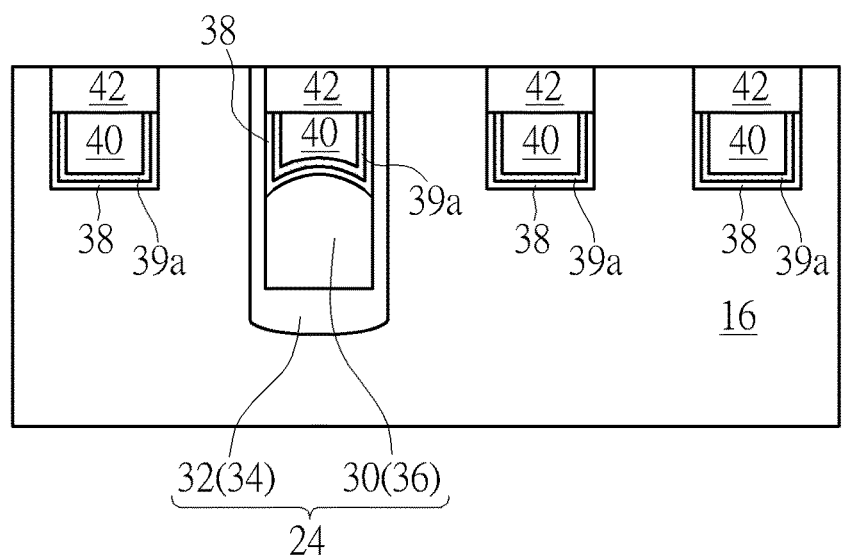
Figure 9:
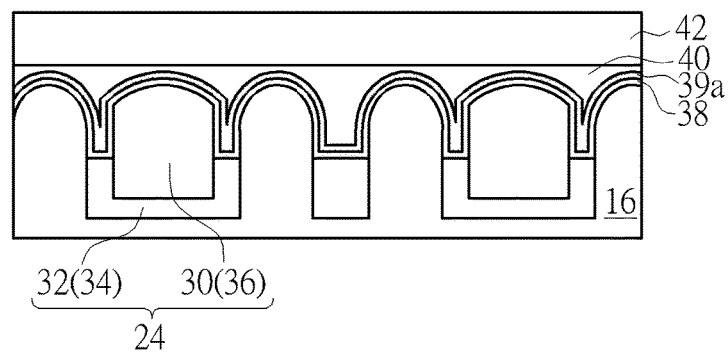

Referring to FIGS. 2-9, FIGS. 2-9 schematically illustrate a method for fabricating a DRAM device according to an preferred embodiment of the present invention, in which FIG. 2 illustrates a top-view diagram, FIG. 3 illustrates a cross-sectional view taken along the sectional line A-A' in FIG. 2, FIG. 4 illustrates a cross-sectional view taken along the sectional line B-B' in FIG. 1, FIG. 5 illustrates a cross-sectional view following the fabrication of FIG. 3, and FIG. 8 and FIG. 9 illustrates a cross-sectional view following the fabrication of FIG. 5 and FIG. 6, respectively. Preferably, the present embodiment pertains to the fabrication of a memory device, and more particularly a dynamic random access memory (DRAM) device 10 with buried gates, in which the DRAM device includes at least one transistor device (not shown) and at least one capacitor structure (not shown) that will be serving as a smallest constituent unit within the DRAM array and also used to receive electrical signals from bit lines 12 and word lines 14.

As shown in FIG. 2, which is a top view of the DRAM device in the present invention, the DRAM device 10 includes a substrate 16 such as a semiconductor substrate or wafer made of silicon, at least one shallow trench isolation (STI) 24 formed in the substrate 16, and a plurality of active areas (AA) 18 defined on the substrate 16. In addition, a memory region 20 and a periphery region (not shown) are also defined on the substrate 16, in which multiple word lines 14 are preferably formed within the substrate 16 in the memory region 20 and multiple bit lines 12 are preferably formed on the substrate 16 in the memory region 20, while other active devices (not shown) could be formed on the periphery region. For simplicity purposes, it should be noted that only devices or elements on the memory region 20 are shown in FIG. 1 while elements on the periphery region are omitted.

In this embodiment, the active regions 18 are disposed, for example, parallel to each other and extending along a first direction, and the word lines 14 or multiple gates (i.e. buried word line) 22 are disposed within the substrate 16 and passing through the active regions 18 and STI 24. Preferably, the gates 22 are disposed extending along a second direction, such as a y-direction different from the first direction, in which the second direction crosses the first direction at an angle less than 90 degrees.

On the other hand, the bit lines 12 are disposed on the substrate 16 parallel to each other and extending along a third direction, such as a x-direction crossing the active regions 18 and STI 24, in which the third direction is different from the first direction and preferably orthogonal to the second direction. In other words, the first direction, second direction, and third direction are all different from each other while the first direction is not orthogonal to both the second direction and the third direction. Preferably, contact plugs including bit line contacts (BLC) (not shown) are formed in the active regions 18 adjacent to two sides of the word lines 14 to electrically connect to source/drain region (not shown) of each transistor element and storage node (SN) contacts (not shown) are formed to electrically connect to a capacitor.

The fabrication of buried word lines 14 is explained below. As shown in FIGS. 3-4, which are cross-sectional views taken along the sectional line A-A' and the sectional line B-B' respectively in FIG. 2, a first trench 26 is first formed in the substrate 16, a shallow trench isolation (STI) 24 is then formed in the first trench 26, and a second trench 28 is formed adjacent to the first trench 26, wherein the STI 24 includes a upper portion 30 and a lower portion 32 and the top surface of the upper portion 30 is even with or higher than the bottom surface of the second trench 28.

Specifically, the formation of the STI 24 could be accomplished by first forming a STI (not shown), and then forming a patterned mask (not shown) on the substrate 16 to expose part of the first trench 26 and part of the substrate 16 surrounding the STI. An etch process is performed using the patterned mask as a etch mask to form a first trench 26 and a second trench 28. The first trench 26 would be deeper than the second trench 28 since the etch rates for the STI and the substrate 16 in the etch process are different. The remaining STI after the etching process now becomes a liner 34. In order to have the first trench 26 and the second trench 28 with same depth, a dielectric layer 36 is filled in the first trench 26 to complete the manufacture of the STI 24, which include an upper portion 30 made of the dielectric layer 36 and a lower portion 32 made of the liner 34.

In this embodiment, the liner 34 and the dielectric layer 36 are preferably made of different materials, in which the liner 34 in this embodiment is preferably made of silicon oxide while the dielectric layer 36 is made of silicon nitride. Preferably, an etchant of the aforementioned etching process is selected from the group consisting of $CH_3F$ and $O_2$, and an etching selectivity of silicon oxide to silicon nitride is controlled at 20:1. In other words, a greater portion of the liner 34 and a smaller or lesser portion of the dielectric layer 36 were removed during the aforementioned etching process so that the top surface of the remaining dielectric layer 36 or top portion 30 of the STI 24 is even with or slightly higher than the bottom surface of the adjacent second trench 28.

Next, as shown in FIG. 5, which is a schematic cross-sectional view following the process in FIG. 3, a gate dielectric 38 is conformally formed on the surface of the first trench 26 and the second trench 28. The gate dielectric 38 preferably includes the silicon oxide formed by an in-situ steam generation (ISSG) process or a high-k dielectric formed by an atomic layer deposition process, in which the high-k dielectric layer is preferably selected from dielectric materials having dielectric constant (k value) larger than 4. For instance, the high-k dielectric layer may be selected from hafnium oxide ($HfO_2$), hafnium silicon oxide (HfSiO$_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

For the conventional process in prior art, a titanium nitride (TiN) layer would be formed first as a barrier after the gate dielectric is formed to increase the adhesion between the buried word line metal and the gate dielectric and to prevent the volcano effect happening in the tungsten-based word line metal. However, in order to solve the aforementioned row hammering issue frequently happening in the word line, as shown in FIG. 5 in the embodiment of the present invention, an n-type work function metal layer 39 would be first formed on the gate dielectric 38 before the formation of the TiN layer. The n-type work function metal layer 39 is formed conformally on the gate dielectric 38 and the substrate 16, in which the material may be selected from a metal with a work function ranging between 3.9 eV and 4.3 eV, such as but not limited to titanium (Ti), titanium aluminide (TiAl), zirconium aluminide (ZrAl), tungsten aluminide (WAl), tantalum aluminide (TaAl), hafnium aluminide (HfAl), or titanium aluminum carbide (TiAlC). The n-type work function layer 39 may adjust the work function of the buried word line formed thereafter, thereby preventing the row hammering issue resulted from the word line leakage to a non-accessed physically adjacent row and relevant data corruption and failure.

After the n-type work function metal layer 39 is formed, the manufacture of a TiN barrier layer is conducted. In one embodiment of the present invention, the TiN layer may be formed by directly transforming the n-type work function layer 39. As shown in FIG. 6, in the condition that titanium is used as the material of the n-type work function layer 39, a nitrogen radical treatment P1 may be performed to the surface of the n-type work function layer 39 to transform part of the n-type work function metal into TiN. The nitrogen radical treatment P1 may include the steps of introducing nitrogen ($N_2$) and ammonia ($NH_3$) and conducting a high temperature plasma treatment. Through this treatment, the ratio of TiN to Ti in the processed n-type work function layer 39a would gradually increase from the side adjacent to the gate dielectric 38 to the surface side. For example, the Ti layer with thickness of 50 Å will be partly transformed into an outer TiN portion with thickness of 20 Å after the nitrogen radical treatment.

In another embodiment of the present invention, as shown in FIG. 7, the TiN layer 41 may be directly and conformally deposited on the n-type work function layer 39. This approach is suitable to all kinds of n-type work function metal materials rather than just limited to use titanium.

After the TiN layer or portion is formed, as shown in FIG. 8, a conductive layer (not shown) with a thickness about 500 Å is formed on the substrate, in which the material may be selected from low-resistance materials, such as copper (Cu), aluminum (Al), Tungsten (W), titanium-aluminum alloy (TiAl), cobalt tungsten phosphide (CoWP) or any combination thereof. An etching back process is then conducted to remove part of the conductive layer and part of the n-type work function metal layer 39a outside the trench, so that the conductive layer and the n-type work function metal layer 39a and the gate dielectric remain only within the trench and have a top surface slightly lower than the surface of the substrate 16, thereby forming the buried word line 40. Next, a hard mask 42 is formed on the buried word line 40, in which the top surfaces of the hard mask 42 and the substrate 16 are coplanar. The material of the hard mask 42 may be silicon nitride.

Afterward, an ion implantation process could be conducted depending on the demand of the process to form doped regions (not shown) such as lightly doped drain or source/drain region in the substrate 16 adjacent to two sides of the buried word line 40. Finally, a contact plug process could be conducted to form bit line contacts (BLC) adjacent to two sides of the buried word line 40 electrically connecting the source/drain regions and bit lines formed thereafter and storage node contacts electrically connecting the source/drain region and capacitors fabricated in the later process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure for preventing row hammering issue in DRAM cell, comprising:
   a substrate;
   a plurality of trenches comprising a first trench and a second trench;
   a gate dielectric conformally disposed on said trenches, respectively;
   a work function metal layer conformally on and directly contacting said gate dielectric;
   a shallow trench isolation, said shallow trench isolation includes an upper portion and a lower portion, said lower portion is disposed on said first trench, and said upper portion is disposed on said lower portion; and
   a plurality of buried word lines, each buried word line of said buried word lines disposed on said work function metal layer, respectively;
   wherein said first trench is deeper than said second trench, said work function metal layer comprises materials of titanium and titanium nitride, and a ratio of said titanium nitride to said titanium in said work function metal layer gradually increases from a side of said work function metal layer adjacent to said gate dielectric to another side of said work function metal layer adjacent to said each buried word line; said lower portion of said shallow trench isolation directly contacts and covers around entire perimeter surface of said first trench, said upper portion of said shallow trench isolation has a top surface being higher than a bottom surface of said second trench, and has a different material composition from said lower portion of said shallow trench isolation, a thickness of said lower portion is thicker at bottom than at sidewalls thereof, and said top surface of said upper portion of said shallow trench isolation has a convexly-curved shape; said gate dielectric being conformally disposed on said lower portion and said upper portion of said shallow trench isolation in said first trench, and an entire top surface of said buried word line is flat.

2. The semiconductor structure for preventing row hammering issue in DRAM cell of claim 1, wherein a width of said lower portion of said shallow trench isolation is same as a width of said first trench.

3. The semiconductor structure for preventing row hammering issue in DRAM cell of claim 1, further comprising a hard mask on said buried word line.

4. The semiconductor structure for preventing row hammering issue in DRAM cell of claim 3, wherein a material of said hard mask is silicon nitride.

5. The semiconductor structure for preventing row hammering issue in DRAM cell of claim 1, wherein said work function metal layer is an n-type work function metal layer.

6. The semiconductor structure for preventing row hammering issue in DRAM cell of claim 1, wherein a material of said gate dielectric is chosen from $HfO_2$, $HfSiO_4$, $HfSiON$, $Al_2O_3$, $La_2O_3$, $Ta_2O_5$, $Y_2O_3$, $ZrO_2$, $SrTiO_3$, $ZrSiO_4$, $HfZrO_4$, $SrBi_2Ta_2O_9$ (SBT), $PbZr_xTi_{1-x}O_3$ (PZT), $Ba_xSr_{1-x}TiO_3$ (BST), or any combination thereof.

7. The semiconductor structure for preventing row hammering issue in DRAM cell of claim 1, wherein a material of said buried word line is chosen from Cu, Al, W, TiAl, CoWP, or any combination thereof.

* * * * *